(12) United States Patent
Suzuki et al.

(10) Patent No.: US 8,928,871 B2
(45) Date of Patent: Jan. 6, 2015

(54) REFLECTIVE MASK

(75) Inventors: Masaru Suzuki, Mie (JP); Nobuhiro Komine, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/597,721

(22) Filed: Aug. 29, 2012

(65) Prior Publication Data

US 2013/0208252 A1   Aug. 15, 2013

(30) Foreign Application Priority Data

Feb. 15, 2012 (JP) ................................. 2012-030811

(51) Int. Cl.
| | | |
|---|---|---|
| G03B 27/54 | (2006.01) | |
| G02B 5/08 | (2006.01) | |
| G01J 1/04 | (2006.01) | |
| G03F 7/20 | (2006.01) | |

(52) U.S. Cl.
CPC .............. G02B 5/08 (2013.01); G03F 7/70941 (2013.01)
USPC .......................................... 356/124; 356/121

(58) Field of Classification Search
CPC ...... G02B 5/08; G02B 27/54; G03F 7/70941; G03F 7/7085; G03F 7/70591
USPC ........ 356/600–620, 121–124; 355/53, 71, 75, 355/77; 430/5, 20, 296, 312, 394, 311
See application file for complete search history.

(56) References Cited

U.S. PATENT DOCUMENTS

| | | | | |
|---|---|---|---|---|
| 4,657,379 | A * | 4/1987 | Suwa ............................... | 355/53 |
| 5,328,784 | A * | 7/1994 | Fukuda .............................. | 430/5 |
| 5,751,403 | A * | 5/1998 | Mizutani et al. ................. | 355/53 |
| 6,191,429 | B1 * | 2/2001 | Suwa ............................. | 250/548 |
| 6,265,137 | B1 * | 7/2001 | Hirukawa ...................... | 430/312 |
| 6,727,980 | B2 * | 4/2004 | Ota et al. .......................... | 355/55 |
| 6,862,076 | B2 | 3/2005 | Mulder et al. | |
| 7,022,440 | B2 * | 4/2006 | Takeuchi .......................... | 430/9 |
| 7,101,645 | B1 * | 9/2006 | La Fontaine et al. ............. | 430/5 |

(Continued)

FOREIGN PATENT DOCUMENTS

| | | |
|---|---|---|
| JP | 3874755 | 11/2006 |
| JP | 2008-288338 A | 11/2008 |
| JP | 2009-200288 | 9/2009 |
| JP | 2010-205896 | 9/2010 |

OTHER PUBLICATIONS

Office Action issued May 20, 2014, in Japanese Patent Application No. 2012-030811 with English translation.

*Primary Examiner* — Sang Nguyen
(74) *Attorney, Agent, or Firm* — Oblon, Spivak, McClelland, Maier & Neustadt, L.L.P.

(57) ABSTRACT

According to a flare measuring method in an embodiment, a reflective mask, in which one reflective coordinate in a slit direction in a mask surface is determined when one scanning coordinate is determined, is placed on a scanner that includes a reflective projection optical system. Moreover, a light intensity of the exposure light is measured by performing a scanning exposure on an illuminance sensor moved to a predetermined position in the slit direction in a slit imaging plane. Then, an amount of flare at an intra-slit position corresponding to a position of the illuminance sensor in the slit direction is calculated by using a light intensity of exposure light received from an intra-slit position that does not correspond to the position of the illuminance sensor in the slit direction in the exposure light.

2 Claims, 9 Drawing Sheets

(56) References Cited

U.S. PATENT DOCUMENTS

| | | | |
|---|---|---|---|
| 7,375,390 B2* | 5/2008 | Lee et al. | 257/306 |
| 7,492,443 B2* | 2/2009 | Van Der Werf et al. | 355/72 |
| 7,791,718 B2* | 9/2010 | Hagiwara | 356/124 |
| 7,887,977 B2* | 2/2011 | Sugimoto | 430/5 |
| 7,914,953 B2* | 3/2011 | Shimizu et al. | 430/5 |
| 8,021,805 B2* | 9/2011 | Oh et al. | 430/5 |
| 2002/0079466 A1* | 6/2002 | Talmi | 250/559.1 |
| 2005/0140986 A1* | 6/2005 | Butler | 356/509 |
| 2006/0268247 A1* | 11/2006 | Butler | 355/53 |
| 2007/0263190 A1* | 11/2007 | De Boeij et al. | 355/53 |
| 2008/0246941 A1* | 10/2008 | Otaki | 355/67 |
| 2009/0218495 A1* | 9/2009 | Leroux et al. | 250/362 |
| 2009/0323037 A1* | 12/2009 | Aarts et al. | 355/67 |
| 2010/0167182 A1* | 7/2010 | Oh et al. | 430/5 |
| 2011/0278731 A1* | 11/2011 | Fujimura et al. | 257/774 |

\* cited by examiner

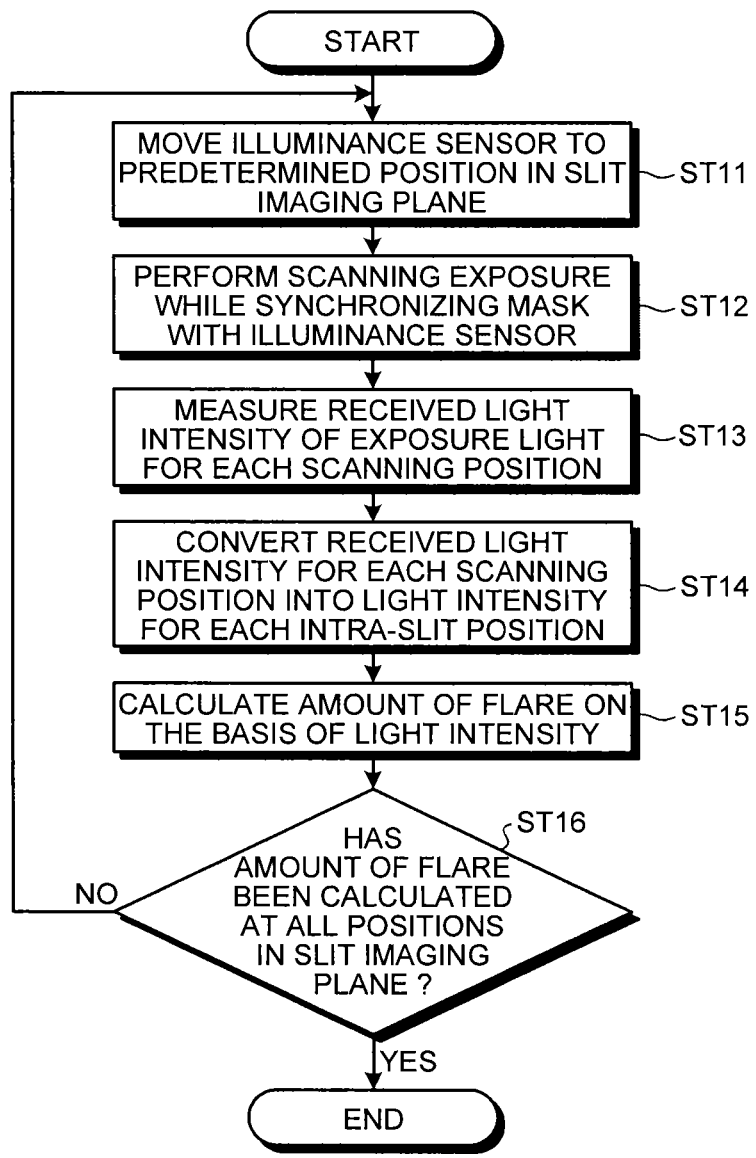

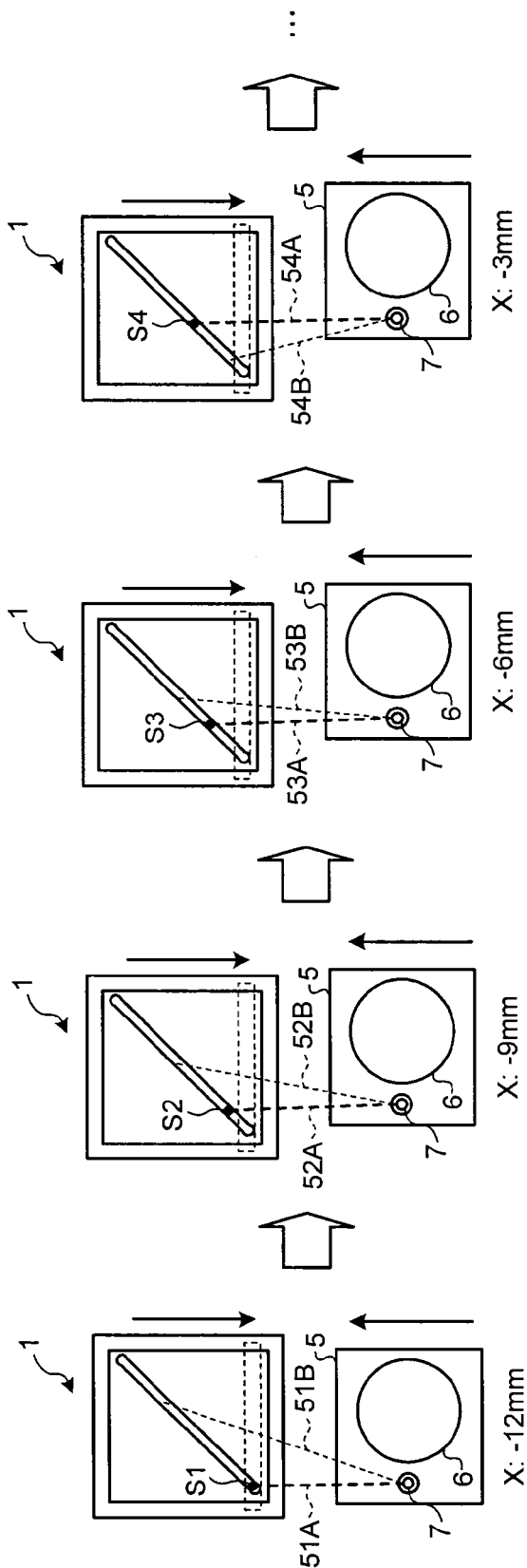

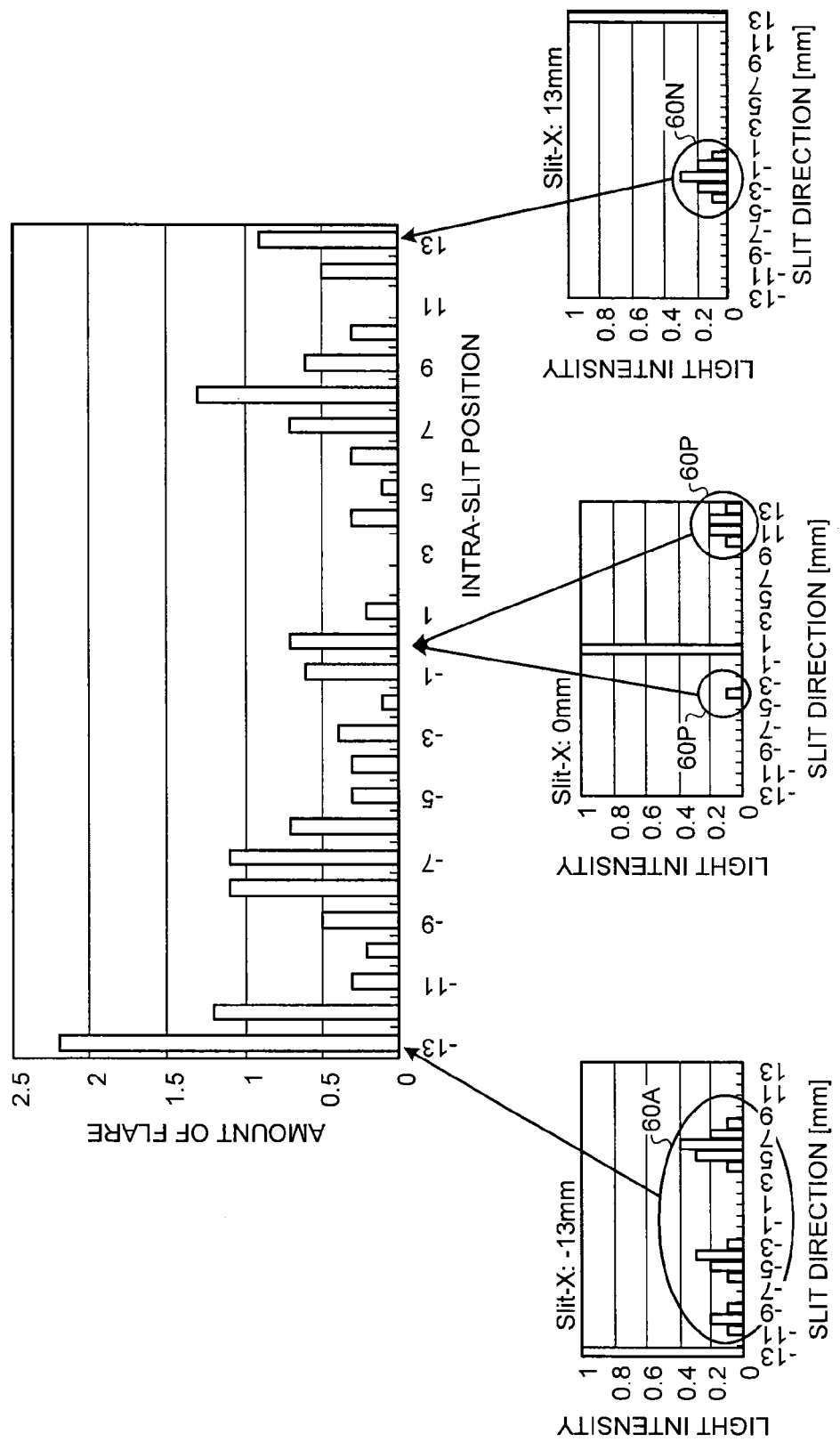

REFLECTIVE MASK

CROSS-REFERENCE TO RELATED APPLICATIONS

This application is based upon and claims the benefit of priority from Japanese Patent Application No. 2012-030811, filed on Feb. 15, 2012; the entire contents of which are incorporated herein by reference.

FIELD

An embodiment described herein relates generally to a flare measuring method, a reflective mask, and an exposure apparatus.

BACKGROUND

Scaling of semiconductor devices leads to a decrease in wavelength of light sources used in exposure apparatus, and exposure apparatus (EUV exposure apparatus) that uses an extreme ultraviolet light (hereinafter, EUV light) with a wavelength of approximately 100 nm or less is being used more and more for manufacturing semiconductor devices. In the EUV exposure apparatus, the wavelength of the light source is short and therefore almost all of the optical members act as reflective members. Therefore, flare easily occurs in the EUV exposure apparatus over a wide range. When flare occurs, a pattern having the desired pattern dimension cannot be formed unless optical correction in consideration of flare is correctly performed.

Thus, it is desirable to highly accurately measure the amount of flare that occurs in a reflective projection optical system of an exposure apparatus (for example, EUV exposure apparatus) to realize optical correction and the like in consideration of flare.

BRIEF DESCRIPTION OF THE DRAWINGS

FIG. 3 is a flowchart illustrating a process procedure of a flare calculating process according to the embodiment;

FIG. 5 is a diagram for explaining the relationship between the position of an illuminance sensor and the intra-slit position;

FIG. 7 is a diagram for explaining a calculating process of a flare distribution in a slit.

DETAILED DESCRIPTION

According an embodiment, a flare measuring method is provided. In the flare measuring method, a reflective mask, in which one reflective coordinate in a slit direction in a mask surface is determined when one scanning coordinate is determined during a scanning exposure, is placed on a reticle stage of a scanner that includes a reflective projection optical system. Moreover, an illuminance sensor that measures a received light intensity of exposure light is moved to a pre-determined position in the slit direction in a slit imaging plane corresponding to an intra-slit position. Then, the scanning exposure using the reflective mask is performed on a region including a region in which the illuminance sensor is arranged while synchronizing a movement of the reflective mask in a scanning direction with a movement of the illuminance sensor in the scanning direction. Moreover, a light intensity of the exposure light is measured by using the illuminance sensor during the scanning exposure. Then, an amount of flare at an intra-slit position corresponding to a position of the illuminance sensor in the slit direction is calculated by using a light intensity of exposure light received from an intra-slit position that does not correspond to the position of the illuminance sensor in the slit direction in the exposure light.

A flare measuring method, a reflective mask, and an exposure apparatus according to the embodiment will be explained below in detail with reference to the accompanying drawings. The present invention is not limited to this embodiment.

(Embodiment)

Figure 1:
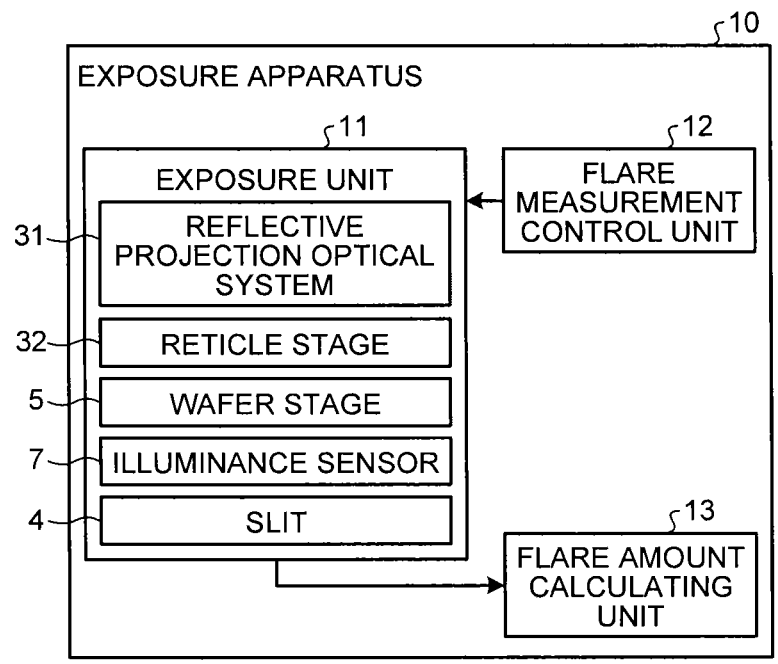
FIG. 1 is a block diagram illustrating the configuration of an exposure apparatus according to an embodiment.

FIG. 1 is a block diagram illustrating the configuration of an exposure apparatus according to the embodiment. An exposure apparatus 10 is a scanning exposure apparatus (scanner) that performs scanning exposure by using a reflective projection optical system 31 and is, for example, an EUV (Extreme Ultraviolet Light) exposure apparatus. The exposure apparatus 10, for example, performs exposure by using exposure light with a wavelength of less than approximately 100 nm.

The exposure apparatus 10 includes an exposure unit 11, a flare measurement control unit 12, and a flare amount calculating unit 13. The exposure unit 11 performs exposure on a substrate (such as a wafer). The exposure unit 11 includes the reflective projection optical system 31, a reticle stage (mask stage) 32, a wafer stage (substrate stage) 5, an illuminance sensor 7, and a slit 4.

In the exposure unit 11 in the present embodiment, the reflective projection optical system 31 has a function of propagating the exposure light onto a mask by using a reflective member such as a mirror. A mask for wafer exposure or a mask for flare measurement is placed on the reticle stage 32.

Moreover, a wafer is placed on the wafer stage 5. The illuminance sensor 7 is arranged on the wafer stage 5, and, when the amount of flare is measured, the illuminance sensor 7 measures the light intensity of the exposure light. Moreover, the slit 4 is an opening used when performing scanning exposure on a wafer or the illuminance sensor 7.

When scanning exposure is performed on a wafer, the exposure unit 11 performs a scanning exposure operation while synchronizing the movement of the mask for wafer exposure in the scanning direction with the movement of the wafer (wafer stage 5) in a scanning direction. Moreover, when scanning exposure is performed on the illuminance sensor 7, the exposure unit 11 performs a scanning exposure operation while synchronizing the mask for flare measurement with the illuminance sensor 7 (wafer stage 5) according to an instruction from the flare measurement control unit 12.

The mask (reticle) for flare measurement is a reflective mask and has a substantially rectangular mask pattern region. One linear reflective pattern is formed on one diagonal in the mask pattern region.

The flare measurement control unit 12 controls the operation of the exposure unit 11 when the amount of flare is measured. The flare measurement control unit 12 issues instructions to the exposure unit 11 on the position (position in a slit direction) of the wafer stage 5 at which the illuminance sensor 7 is arranged, a scanning operation of the reticle stage 32 on which the mask for flare measurement is placed, a scanning operation of the wafer stage 5, and the like.

The flare amount calculating unit 13 calculates the amount of flare that occurs in the reflective projection optical system 31 of the exposure apparatus 10 on the basis of the light intensity measured by the illuminance sensor 7. Moreover, the flare amount calculating unit 13 calculates a flare map (distribution of the amount of flare in the slit direction in the slit 4) by using the calculated amount of flare.

Figure 2:
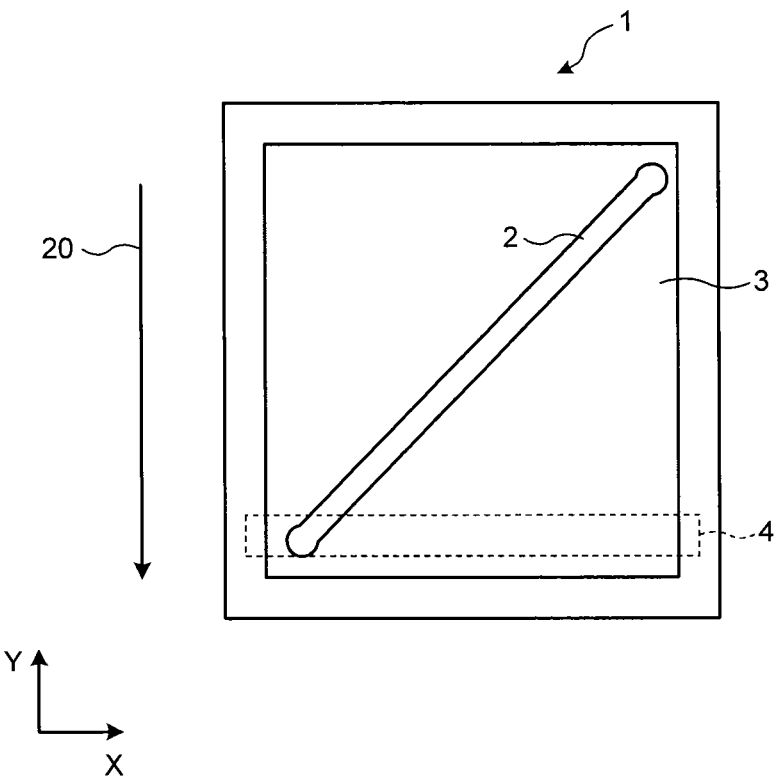
FIG. 2 is a diagram illustrating the configuration of a mask for flare measurement.

FIG. 2 is a diagram illustrating the configuration of the mask for flare measurement. FIG. 2 illustrates a top view of a mask 1 as an example of the mask for flare measurement. The mask 1 includes a reflective pattern 2 and a light blocking pattern 3. The reflective pattern 2 is a pattern that reflects the exposure light and the light blocking pattern 3 is a pattern that blocks the exposure light. Therefore, the exposure light emitted from the light source is reflected by the reflective pattern 2 and is blocked by the light blocking pattern 3. The slit 4 is linearly opened, causes the exposure light emitted to the opening to pass, and blocks the exposure light emitted to a portion other than the opening.

When the amount of flare is measured, the mask 1 is irradiated with the exposure light via the slit 4 of the exposure unit 11. When the scanning exposure is performed, the reticle stage 32 (not shown here) on which the mask 1 is placed is moved in a scanning direction 20.

The scanning direction 20 of the mask 1 is a lateral direction (Y direction) of the slit 4. In other words, the longitudinal direction of the slit 4 is an X direction and the lateral direction of the slit 4 is the Y direction, which is parallel to the scanning direction 20.

The reflective pattern 2 in the present embodiment is diagonally arranged on the mask 1 (mask pattern forming region). Specifically, the reflective pattern 2 is arranged in the exposure region of the mask 1 at an angle of approximately 45° with respect to the X direction and the Y direction. In the mask 1, the region other than the reflective pattern 2 becomes the light blocking pattern 3. Thus, the mask 1 in the present embodiment is a mask in which one set of reflective coordinates in the slit direction of the mask 1 is determined when the scanning coordinates of the exposure apparatus 10 are determined.

Figure 4A:
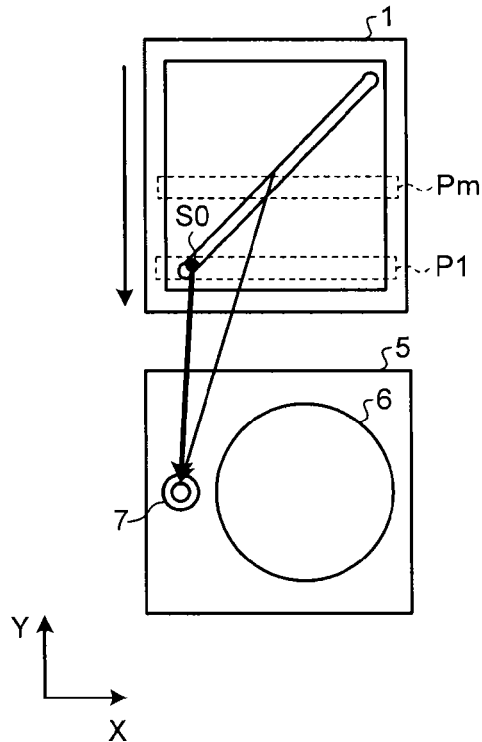
FIG. 4A to FIG. 4C are diagrams for explaining a light intensity measuring method according to the embodiment.
Figure 4B:
Figure 4C:
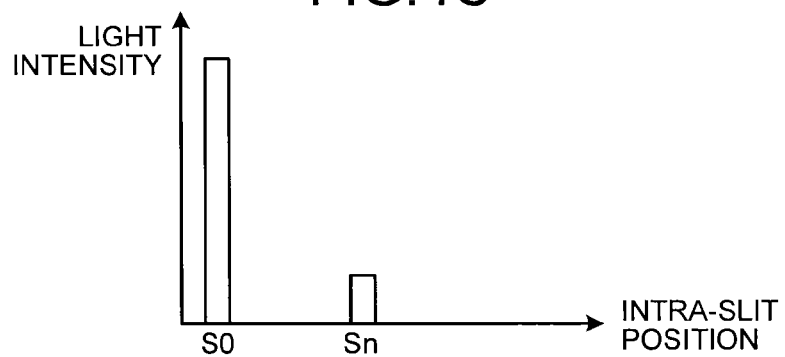

Next, a method of measuring the light intensity of the exposure light reflected from the mask 1 will be explained. FIG. 3 is a flowchart illustrating a process procedure of a flare calculating process according to the embodiment. FIG. 4A to FIG. 4C are diagrams for explaining a light intensity measuring method according to the embodiment. FIG. 4A illustrates the positional relationship between the mask 1 and the illuminance sensor 7. FIG. 4B illustrates the received light intensity at each scanning position by the illuminance sensor 7 and FIG. 4C illustrates the light intensity at each intra-slit position.

As shown in FIG. 4A, the illuminance sensor (light intensity measuring unit) 7 is arranged on the wafer stage 5 at a position other than the region in which a wafer 6 is placed. Moreover, when the light intensity of the exposure light reflected from the mask 1 is measured, the wafer stage 5 and the reticle stage 32 are synchronously moved so that the mask 1 is arranged over the illuminance sensor 7.

In the present embodiment, the illuminance sensor 7 measures the light intensity at various intra-slit positions in the longitudinal direction in the slit imaging plane. Therefore, the exposure unit 11 moves the illuminance sensor 7 to a predetermined position in the slit direction in the slit imaging plane corresponding to the intra-slit position (Step ST11).

For example, the exposure unit 11 moves the illuminance sensor 7 to the X coordinate that is the same as that of an intra-slit position S0 to measure the light intensity at the intra-slit position S0. The exposure unit 11 moves the illuminance sensor 7 by moving the wafer stage 5 in the longitudinal direction (X direction) of the slit 4.

Then, the exposure unit 11 performs scanning exposure on the illuminance sensor 7 while synchronizing the mask 1 (the reticle stage 32) with the illuminance sensor 7 (the wafer stage 5) (Step ST12). Specifically, the exposure unit 11 performs scanning exposure using the mask 1 on the region including the region in which the illuminance sensor 7 is arranged. The position of the reflective light from the mask 1 changes in the slit direction by performing scanning exposure.

Then, the illuminance sensor 7 measures the received light intensity of the exposure light for each scanning position (Step ST13). The illuminance sensor 7 measures the received light intensity of the exposure light at various scanning positions, such as a first scanning position P1, a second scanning position P2 (not shown), and an m-th (m is a natural number of 2 or more) scanning position Pm. Consequently, the received light intensity of the exposure light at the intra-slit position S0 can be measured at various scanning positions.

In the present embodiment, the reflective pattern 2 is diagonally formed on the mask 1, therefore, the intersection region of the reflective pattern 2 and the slit 4 changes for each scanning position. Among the intersection regions, the intersection region having an X coordinate the same as that of the intra-slit position S0 is the region that is irradiated with original exposure light that is not due to flare. Therefore, when the illuminance sensor 7 is moved to the X coordinate that is the same as that of the intra-slit position S0, the exposure light that reaches the illuminance sensor 7 from the intersection region having an X coordinate the same as that of the intra-slit position S0 is the original exposure light.

In contrast, when the illuminance sensor 7 is moved to the X coordinate that is the same as that of the intra-slit position S0, the exposure light that reaches the illuminance sensor 7 from the intersection region having an X coordinate different from that of the intra-slit position S0 is the exposure light due to flare.

In other words, the exposure light that is emitted to the intra-slit position (X coordinate) at which the illuminance sensor 7 is arranged and reaches the illuminance sensor 7 is the original exposure light. The exposure light that is emitted to a position different from the intra-slit position (X coordinate) at which the illuminance sensor 7 is arranged and reaches the illuminance sensor 7 is the exposure light due to flare.

The flare amount calculating unit 13 calculates the light intensity of the exposure light received from a position other than the intra-slit position at which the illuminance sensor 7 is present among the light intensities of the exposure light received by the illuminance sensor 7 during scanning exposure as flare.

FIG. 4B illustrates the received light intensity at each scanning position measured at the intra-slit position S0. In FIG. 4B, the horizontal axis indicates the received light intensity and the vertical axis indicates the scanning position. For example, at the X coordinate at which the illuminance sensor 7 is arranged, when the reflective pattern 2 and the slit 4 overlap with each other at the first scanning position P1, the received light intensity at the first scanning position P1 is the received light intensity with respect to the original exposure light. In contrast, the received light intensity at a position (for example, the m-th scanning position Pm) other than the first scanning position P1 is the received light intensity due to flare.

The flare amount calculating unit 13 converts the light intensity at each scanning position into the light intensity at each intra-slit position by using the measurement result shown in FIG. 4B. Specifically, the flare amount calculating unit 13 stores in advance the light intensity of the exposure light received by the illuminance sensor 7 at each scanning time from the start to the end of scanning exposure. Then, the flare amount calculating unit 13 converts the light intensity at each stored scanning position (scanning time) into the light intensity at each coordinate (each intra-slit position) in the slit direction on the basis of the correspondence relationship between the scanning coordinates of the mask 1 in the scanning direction and the reflective coordinates in the slit direction (Step ST14). At this point, the flare amount calculating unit 13 converts the light intensity at each scanning position into the light intensity at each intra-slit position on the basis of the region of the mask 1 in which the reflective pattern 2 is formed.

FIG. 4C illustrates the light intensity of the exposure light calculated by using the measurement result shown in FIG. 4B. In FIG. 4C, the horizontal axis indicates the intra-slit position and the vertical axis indicates the light intensity of the exposure light. In a similar manner to the measurement result shown in FIG. 4B, the light intensity at the first scanning position P1 at which the slit 4 overlaps with the reflective pattern 2 at the intra-slit position S0 having an X coordinate the same as that of the illuminance sensor 7 is the light intensity of the original exposure light. In contrast, the light intensity at a scanning position (for example, the m-th scanning position Pm) at which the slit 4 does not overlap with the reflective pattern 2 at the intra-slit position S0 having an X coordinate the same as that of the illuminance sensor 7 but the slit 4 overlaps with the reflective pattern 2 at the intra-slit position Sn having an X coordinate different from that of the illuminance sensor 7 is the light intensity due to flare.

The flare amount calculating unit 13 calculates the amount of flare on the basis of the light intensity at each intra-slit position (Step ST15). In other words, the flare amount calculating unit 13 calculates the amount of flare at the intra-slit position corresponding to the arrangement position of the illuminance sensor 7 by using the light intensity of the exposure light received from the intra-slit positions that do not correspond to the arrangement position of the illuminance sensor 7 in the exposure light. In other words, among the light intensities received at each measurement position of illuminance sensor 7, the amount of flare of the projection optical system is calculated by using the light intensities obtained from the intra-slit positions different from the intra-slit position of the illuminance sensor 7.

Then, the exposure unit 11 determines whether the amount of flare has been calculated by moving the illuminance sensor 7 to all the positions in the slit imaging plane (Step ST16). In other words, it is determined whether the light intensity has been measured at all the positions in the slit imaging plane.

If the amount of flare has not been calculated at one or more positions in the slit imaging plane (No in Step ST16), the processes (flare calculating process) from Step ST11 to Step ST16 are repeated. Specifically, the exposure apparatus 10 measures the light intensity at the n-th (n is a natural number of 2 or more) intra-slit position (not shown) in the slit 4. At this point, the exposure unit 11 moves the illuminance sensor 7 to the X coordinate that is the same as that of the n-th intra-slit position Sn (Step ST11). Then, the exposure unit 11 performs scanning exposure while synchronizing the mask 1 with the illuminance sensor 7 (Step ST12), and measures the received light intensity of the exposure light by the illuminance sensor 7. Consequently, the received light intensity of the exposure light at the n-th intra-slit position is measured (Step ST13).

Then, in a similar manner to the case of a first intra-slit position S0, the flare amount calculating unit 13 converts the light intensity at each scanning position into the light intensity at each intra-slit position (Step ST14). Furthermore, the flare amount calculating unit 13 calculates the amount of flare on the basis of the light intensity at each scanning position (Step ST15).

The amount of flare at various intra-slit positions is calculated by repeating the processes (flare calculating process) from Step ST11 to Step ST16 a number of times. When the amount of flare is calculated at all the positions in the slit imaging plane (Yes in Step ST16), the calculating process of the amount of flare ends. Thereafter, the flare amount calculating unit 13 calculates the distribution (flare map) of the amount of flare in the slit 4.

FIG. 5 is a diagram for explaining the relationship between the position of the illuminance sensor and the intra-slit position. In the present embodiment, an explanation is given of a case where the mask pattern forming region (exposure region) of the mask 1 has a width of 27 mm in the X direction. In the following explanation, the intra-slit position corresponding to the n-th position of the illuminance sensor 7 in the X direction is defined as an n-th intra-slit position Sn.

When the mask pattern forming region has a width of 27 mm in the X direction, the slit 4 is set to have a length of approximately 27 mm in the X direction. Then, the first intra-slit position S1 is, for example, set to a position −12 mm in the X direction from the central portion of the imaging plane of the slit 4. In other words, in order to measure the received light intensity at the first intra-slit position S1, the illuminance sensor 7 moves to a position on the imaging plane corresponding to the position −12 mm in the X direction from the central portion of the imaging plane of the slit 4.

Thereafter, the exposure apparatus 10 measures the received light intensity of the exposure light by the illuminance sensor 7 while synchronously scanning the mask 1 and the wafer stage 5 (the illuminance sensor 7). At this point, when the first intra-slit position S1 overlaps with the reflective pattern 2, the received light intensity of original exposure light 51A at the first intra-slit position S1 (X=−12 mm) is measured. Moreover, when the slit 4 overlaps with the reflective pattern 2 at a position (X≠−12 mm) other than the first intra-slit position S1, the received light intensity of exposure light 51B due to flare is measured.

After the received light intensity of the original exposure light 51A at X=−12 mm and the exposure light 51B due to flare is measured, the received light intensity of the exposure light at the next intra-slit position is measured. Therefore, the exposure unit 11 moves the illuminance sensor 7 by a predetermined distance (for example, 3 mm in a plus direction from the current position) in the longitudinal direction of the slit 4. Consequently, for example, a second intra-slit position S2 (the illuminance sensor 7) is set to a position −9 mm in the X direction from the central portion of the slit 4.

Then, the exposure apparatus 10 measures the received light intensity of the exposure light by the illuminance sensor 7 while synchronously scanning the mask 1 and the wafer stage 5. Consequently, the received light intensity of original exposure light 52A at the second intra-slit position S2 (X=−9 mm) and the received light intensity of exposure light 52B due to flare at a position (X≠−9 mm) other than the second intra-slit position S2 are measured.

Thereafter, the received light intensity of the exposure light at the next intra-slit position is further measured. For example, a third intra-slit position S3 is set to a position −6 mm in the X direction from the central portion of the imaging plane of the slit 4.

Then, the exposure apparatus 10 measures the received light intensity of the exposure light by the illuminance sensor 7 while synchronously scanning the mask 1 and the wafer stage 5. Consequently, the received light intensity of original exposure light 53A at the third intra-slit position S3 (X=−6 mm) and the received light intensity of exposure light 53B due to flare at a position (X≠−6 mm) other than the third intra-slit position S3 are measured.

In a similar manner, the process of measuring the received light intensity of the exposure light at the next intra-slit position is repeated. For example, a fourth intra-slit position S4 is set to a position −3 mm in the X direction from the central portion of the imaging plane of the slit 4.

Then, the exposure apparatus 10 measures the received light intensity of the exposure light by the illuminance sensor 7 while synchronously scanning the mask 1 and the wafer stage 5. Consequently, the received light intensity of original exposure light 54A at the fourth intra-slit position S4 (X=−3 mm) and the received light intensity of exposure light 54B due to flare at a position (X≠−3 mm) other than the fourth intra-slit position S4 are measured.

In such a manner, the illuminance sensor 7 is moved to various intra-slit positions (from one end to the other end in the X direction) and measures the received light intensity of the original exposure light at each intra-slit position and the received light intensity of the exposure light due to flare. Then, the flare amount calculating unit 13 calculates the light intensity for each scanning position at each intra-slit position by using the measured received light intensity. Specifically, the flare amount calculating unit 13 calculates the amount of flare that each intra-slit position corresponding to the scanning coordinates gives to the intra-slit position corresponding to the arrangement position of the illuminance sensor 7 for each intra-slit position by using the light intensity at each scanning coordinate.

Figure 6A:
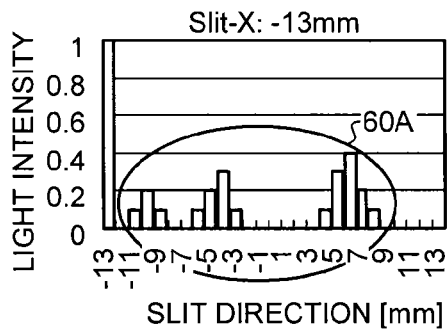
FIG. 6A to FIG. 6N are diagrams illustrating the light intensity at each intra-slit position for each scanning position.
Figure 6B:
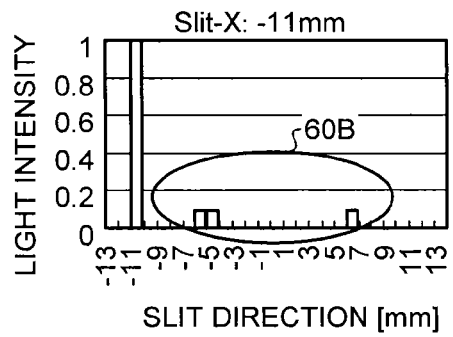
Figure 6C:
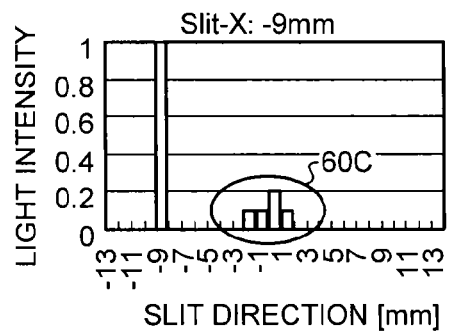
Figure 6D:
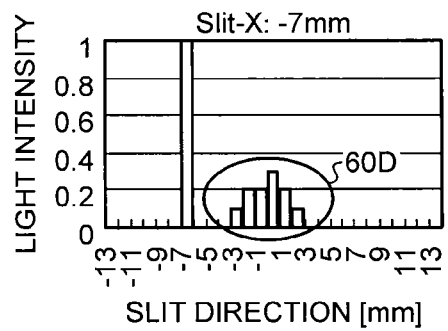
Figure 6E:
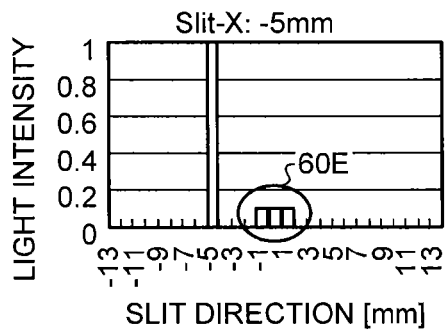
Figure 6F:
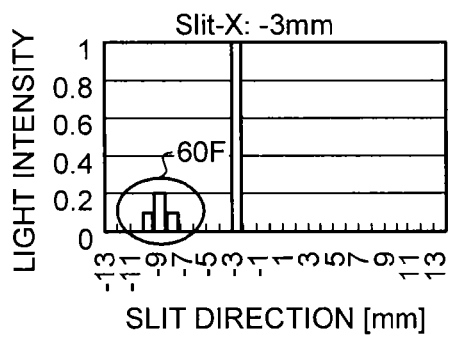
Figure 6G:
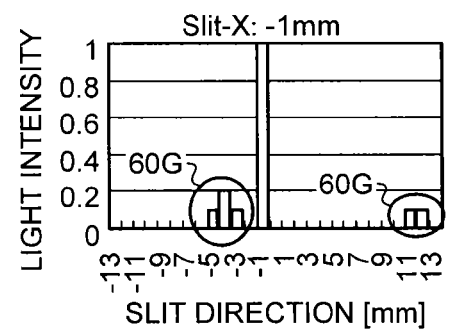
Figure 6H:
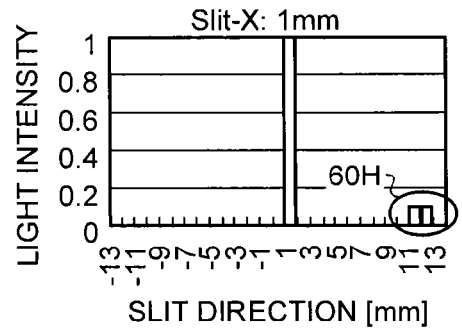
Figure 6I:
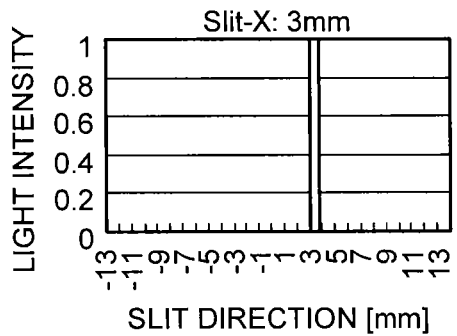
Figure 6J:
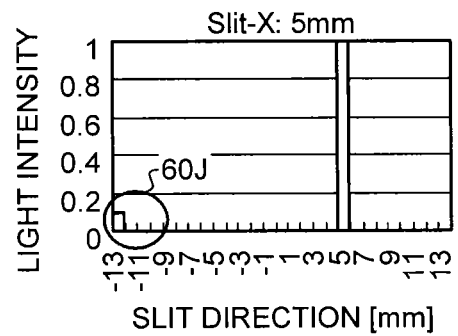
Figure 6K:
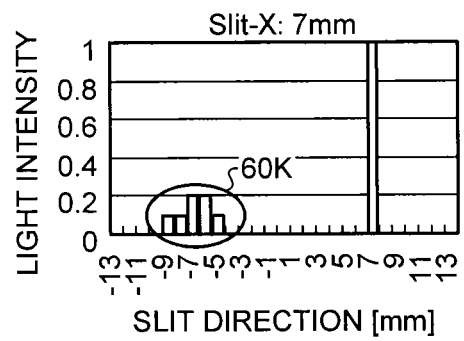
Figure 6L:
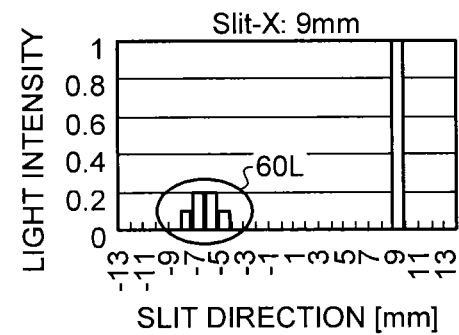
Figure 6M:
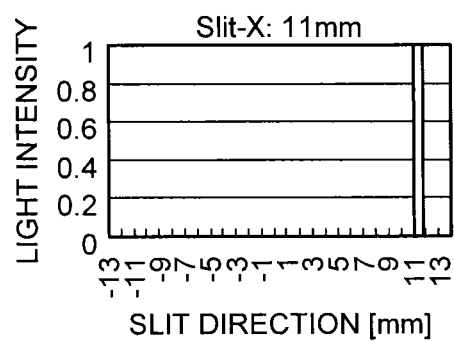
Figure 6N:
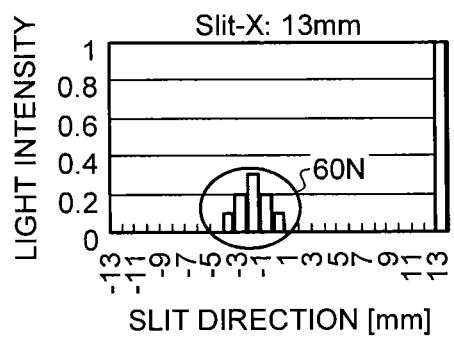

FIG. 6A to FIG. 6N are diagrams illustrating the light intensity at each intra-slit position for each scanning position. FIG. 6A to FIG. 6N are conceptual diagrams illustrating the amount of flare at each intra-slit position and from which intra-slit position each flare is caused. FIG. 6A to FIG. 6G illustrate the light intensity for each scanning position when the intra-slit position is X=−13 mm, −11 mm, −9 mm, −7 mm, −5 mm, −3 mm, and −1 mm, respectively. In a similar manner, FIG. 6H to FIG. 6N illustrate the light intensity for each scanning position when the intra-slit position is X=1 mm, 3 mm, 5 mm, 7 mm, 9 mm, 11 mm, and 13 mm, respectively.

For example, as shown in FIG. 6A, when the intra-slit position is X=−13 mm, the light intensity of the original exposure light is obtained from the position X=−13 mm and light intensity 60A due to flare is obtained from the region of X≠−13 mm.

In a similar manner, as shown in FIG. 6B to FIG. 6G, when the intra-slit position is X=−11 mm, −9 mm, −7 mm, −5 mm, −3 mm, and −1 mm, the light intensity of the original exposure light is obtained from these positions. Then, light intensities 60B, 60C, 60D, 60E, 60F, and 60G due to flare are obtained from the regions of X≠−11 mm, −9 mm, −7 mm, −5 mm, −3 mm, and −1 mm.

Moreover, as shown in FIG. 6H to FIG. 6N, when the intra-slit position is X=1 mm, 5 mm, 7 mm, 9 mm, and 13 mm, the light intensity of the original exposure light is obtained from these positions. Then, light intensities 60H, 60J, 60K, 60L, and 60N due to flare are obtained from the regions of X≠1 mm, 5 mm, 7 mm, 9 mm, and 13 mm. This embodiment illustrates a case where the light intensity due to flare is not detected when the intra-slit position is X=3 mm and 11 mm.

As shown in FIG. 6A to FIG. 6N, it is possible to easily recognize an approximate intra-slit position, from which flare affects the intra-slit position, for each intra-slit position by calculating the light intensity at each intra-slit position for each scanning position.

After the light intensity of the exposure light at each intra-slit position is calculated, the flare amount calculating unit 13 calculates the amount of flare (flare distribution in the slit 4) at each intra-slit position. The amount of flare is, for example, an integrated value of the light intensity due to flare.

FIG. 7 is a diagram for explaining a calculating process of the flare distribution in the slit. For example, when the flare amount calculating unit 13 calculates the light intensity 60A (integrated value) due to flare in the case where the intra-slit position is X=−13 mm, the flare amount calculating unit 13 sets this light intensity 60A as a flare value at the intra-slit position X=−13 mm.

In a similar manner, for example, when the flare amount calculating unit 13 calculates the light intensity 60P (integrated value) due to flare in the case where the intra-slit position is X=0 mm, the flare amount calculating unit 13 sets this light intensity 60P as a flare value at the intra-slit position X=0 mm.

Moreover, for example, when the flare amount calculating unit 13 calculates the light intensity 60N (integrated value) due to flare in the case where the intra-slit position is X=13 mm, the flare amount calculating unit 13 sets this light intensity 60N as a flare value at the intra-slit position X=13 mm.

The flare amount calculating unit 13 calculates the light intensity (integrated value) due to flare at each intra-slit position (X=−13 mm to 13 mm) and sets the calculated light intensity as a flare value at each intra-slit position. Consequently, the flare amount calculating unit 13 calculates the flare map in which the intra-slit position is associated with the amount of flare.

In this manner, the exposure apparatus 10 measures the amount of flare at each intra-slit position (slit coordinates) of the reflective projection optical system 31 and from which slit coordinates each flare occurs. Therefore, it is possible to correctly measure flare over a wide range from the short range to the long range, enabling, for example, flare to be reflected in an optical correction and the like and calculation of a dose map. Moreover, the intra-slit position at which the amount of flare is large can be recognized.

The length of the slit 4 in the X direction differs depending on the size of the exposure region of the mask 1. Therefore, the exposure apparatus 10 may calculate the flare map for each size of the exposure region included in the mask 1.

Moreover, in the present embodiment, an explanation is given of the case of calculating the amount of flare after measuring the received light intensity of the exposure light, however, the amount of flare may be calculated while measuring the received light intensity of the exposure light. In this case, the amount of flare is calculated sequentially starting from the intra-slit position at which the light intensity of the exposure light is measured.

The calculating process of the flare map is performed for each exposure apparatus 10. Then, each exposure apparatus 10 performs optical correction on the basis of the flare map. Semiconductor devices (semiconductor integrated circuits) are manufactured by using the exposure apparatus 10. For example, a semiconductor substrate (such as a wafer) to which resist is applied is carried into the exposure apparatus 10. Then, the exposure apparatus 10 performs exposure on the semiconductor substrate after performing optical correction on the basis of the flare map. The exposed semiconductor substrate is developed, whereby a resist pattern is formed on the semiconductor substrate. A processing target on the semiconductor substrate is processed (for example, etched) with this resist pattern as a mask. When semiconductor devices are manufactured, the calculating process of the flare map, the exposing process after performing optical correction on the basis of the flare map, the developing process, the processing process for the processing target, and the like are repeated for each layer in a wafer process.

In this manner, according to the embodiment, because the reflective pattern 2 is diagonally arranged on the mask 1 and scanning exposure is performed on the illuminance sensor 7 while synchronizing the mask 1 with the illuminance sensor 7 at various intra-slit positions, the amount of flare that occurs in the reflective projection optical system 31 can be measured highly accurately. Consequently, it becomes possible to correctly perform optical correction according to flare, and therefore the yield of semiconductor devices can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reflective mask comprising:
   a substantially rectangular mask pattern region; and
   one linear reflective pattern which is formed on one diagonal of the mask pattern region, wherein,
   in the mask pattern region, an area except for the one diagonal is a light blocking pattern, wherein,
   in the mask pattern region, when the mask pattern region is irradiated with exposure light, the one linear reflective pattern reflects the exposure light at a single reflective coordinate for each scanning coordinate, the single reflective coordinate being a coordinate in a slit direction of the reflective mask, the scanning coordinate being a coordinate in a scanning direction of the reflective mask.

2. The reflective mask according to claim 1, wherein the reflective mask is used for calculating an amount of flare that occurs in a reflective projection optical system in an EUV exposure apparatus.

* * * * *